United States Patent
Tatsumi et al.

(10) Patent No.: US 7,884,010 B2
(45) Date of Patent: Feb. 8, 2011

(54) WIRING STRUCTURE AND METHOD FOR FABRICATING THE SAME

(75) Inventors: Noriyuki Tatsumi, Kasumigaura (JP); Tatsuya Tonogi, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 12/320,687

(22) Filed: Feb. 2, 2009

(65) Prior Publication Data

US 2010/0096755 A1   Apr. 22, 2010

(30) Foreign Application Priority Data

Oct. 17, 2008   (JP) .............................. 2008-269195

(51) Int. Cl.
   *H01L 21/4763*   (2006.01)
(52) U.S. Cl. .................. 438/627; 438/106; 438/107; 438/149; 438/151; 438/618; 257/59; 257/89; 257/257; 257/627; 257/694; 257/E21.577
(58) Field of Classification Search ............... 257/267, 257/625
See application file for complete search history.

(56) References Cited

U.S. PATENT DOCUMENTS

2007/0020931 A1*   1/2007   Koura et al. ............... 438/687

FOREIGN PATENT DOCUMENTS

JP   2007-72428   3/2007

\* cited by examiner

*Primary Examiner*—N Drew Richards
*Assistant Examiner*—Kyoung Lee
(74) *Attorney, Agent, or Firm*—McGinn IP Law Group, PLLC

(57) ABSTRACT

A wiring structure has a silicon layer, a backing layer provided on the silicon layer, the backing layer comprising a copper alloy containing a manganese, and a copper layer provided on the backing layer, and a diffusion barrier layer having an electrical conductivity, the diffusion barrier layer being provided at a region including an interface between the silicon layer and the backing layer, in which a manganese in the diffusion barrier layer is enriched compared with the backing layer.

19 Claims, 9 Drawing Sheets

WIRING STRUCTURE AND METHOD FOR FABRICATING THE SAME

The present application is based on Japanese Patent Application No. 2008-269195 filed on Oct. 17, 2008, the entire contents of which are incorporated herein by reference.

BACKGROUND OF THE INVENTION

1. Field of the Invention

The present invention relates to a wiring structure and a method for fabricating the same, more particularly, to a copper (Cu) based wiring structure and a method for fabricating the same.

2. Related Art

In a display unit such as liquid crystal display, a lot of electronic devices are used. Further, as a semiconductor composing the electronic device, silicon (Si) is principally used. Herein, a bonding electrode contacting to Si is required to have a function of suppressing diffusion of the electrode material composing the bonding electrode into Si in a fabrication process of the electronic device including a heating process.

As a wiring material for an electrode, a wiring layer, a terminal electrode and the like used in the display unit, Japanese Patent Laid-Open No. 2007-72428 (JP-A 2007-72428) discloses the use of a copper alloy doped with an element having a smaller free energy of oxide formation than a free energy of oxide formation of copper (Cu), and having a diffusion coefficient in Cu than a self-diffusion coefficient of Cu (referred as "doping element" in the background of the Invention).

According to the wiring material disclosed by JP-A 2007-72428, the doping element moves to an interface between a substrate having a $SiO_2$ film on its surface and the copper alloy and oxidizes the interface, so that an oxide layer comprising an oxide of the doping element is formed, thereby suppressing diffusion of copper to the substrate comprising silicon by means of the oxide layer (corresponding to a barrier layer which suppresses the diffusion of copper to the substrate comprising silicon).

However, the wiring material as claimed by JP-A 2007-72428 uses the oxide of Cu and the doping element doped to Cu as the barrier layer for suppressing the diffusion of the element to the silicon substrate. Therefore, it is required to securely provide an electrical conduction between the silicon substrate and the wiring provided at an opposite side with respect to the silicon substrate via the barrier layer comprising the oxide having an insulative property. For this case, it is necessary to provide the electrical conduction by a tunnel current by forming an extremely thin film barrier layer, in order to provide the electrical conduction of a current flow between the silicon substrate and the barrier layer. In addition, the barrier layer needs a certain thickness so that the barrier layer shows a function as the barrier layer.

Accordingly, in the wiring material disclosed by JP-A 2007-72428, a precise film thickness control of the barrier layer is required so as to achieve a balance between the function as the barrier layer and the electrical conduction between the silicon substrate and the wiring layer.

Furthermore, an oxide phase is occasionally formed in an oxidation process of the doping element at a grain boundary in the doping element. In this case, there is a possibility of generating a pinhole due to melting of the oxide phase, when an etching process is included in the fabrication process of the electronic device.

SUMMARY OF THE INVENTION

Accordingly, the object of the invention is to provide a wiring structure and a method for fabricating the same, in which an ohmic contact to silicon can be obtained and the diffusion of an element into the silicon can be suppressed.

According to a feature of the invention, a wiring structure comprises:

a silicon layer;

a backing layer provided on the silicon layer, the backing layer comprising a copper alloy containing a manganese;

a copper layer provided on the backing layer; and a diffusion barrier layer having an electrical conductivity, the diffusion barrier layer being provided at a region including an interface between the silicon layer and the backing layer, wherein a manganese in the diffusion barrier layer is enriched compared with the backing layer.

In the wiring structure, the diffusion barrier layer may comprise a silicon composing the silicon layer, a copper composing the backing layer, and the manganese moved to the interface when the silicon layer and the backing layer are heated. The diffusion barrier layer may be in ohmic contact with the silicon layer. The backing layer may be provided on the silicon layer has a manganese concentration enough to form the diffusion barrier layer showing a diffusion barrier property. Further, the copper layer may comprise an oxygen free copper with a purity of 3N or more. The copper alloy may comprise the manganese of 5 at % or more, a balance of a copper, and inevitable impurities.

According to another feature of the invention, a method for fabricating a wiring structure comprises:

forming a backing layer comprising a copper alloy containing a manganese on a silicon layer in an oxygen free atmosphere;

forming a copper layer on the backing layer; and carrying out a heat treatment on the silicon layer and the backing layer to enrich the manganese at an interface between the silicon layer and the backing layer, thereby forming a diffusion barrier layer having an electrical conductivity.

In the method for fabricating a wiring structure, the copper alloy may comprise the manganese of 5 at % or more, a balance of a copper, and inevitable impurities. Further, the heat treatment may be carried out on the silicon layer and the backing layer at a temperature from 200° C. to 300° C. in vacuum.

ADVANTAGES OF THE INVENTION

According to the present invention, it is possible to provide a wiring structure and a method for fabricating the same, in which an ohmic contact to silicon can be obtained and the diffusion of an element into the silicon can be suppressed.

BRIEF DESCRIPTION OF THE SCHEMATIC DIAGRAMS

Next, the preferred embodiment according to the invention will be explained in conjunction with appended schematic diagrams, wherein.

DETAILED DESCRIPTION OF THE EMBODIMENT

Figure 1A:
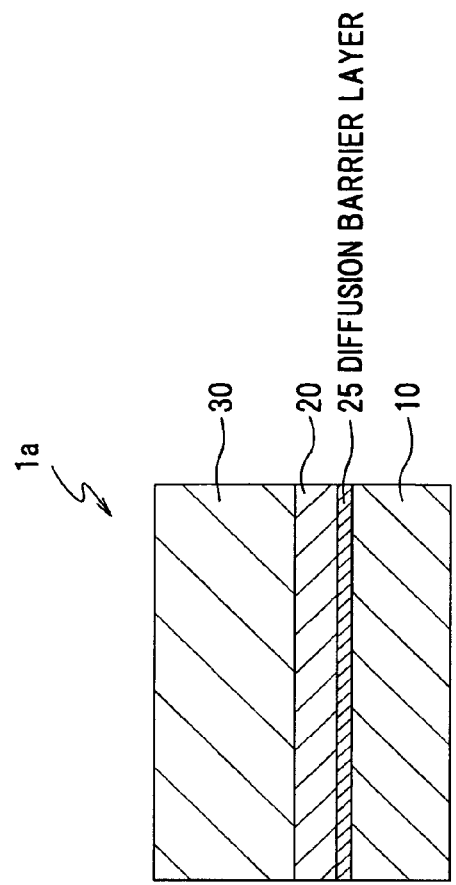
FIGS. 1A and 1B are vertical cross sectional views of a wiring structure in a preferred embodiment according to the present invention.
Figure 1B:
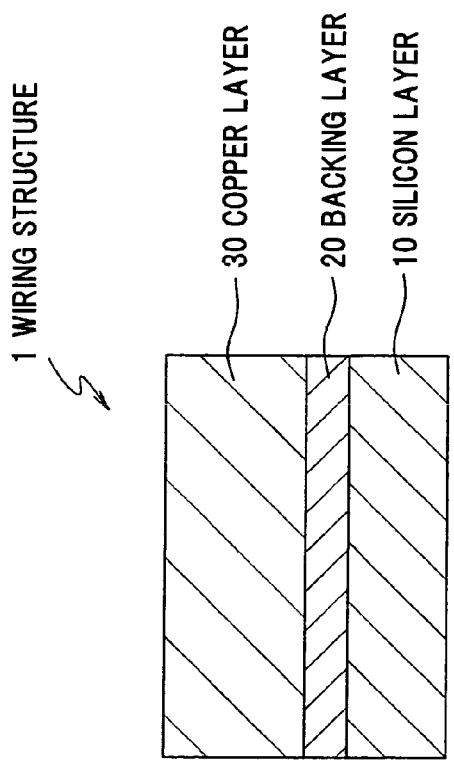

FIGS. 1A and 1B are vertical cross sectional views of a wiring structure in a preferred embodiment according to the present invention.

FIG. 1A shows a wiring structure 1 in a state that heat treatment is not carried out as an example of a wiring structure in the preferred embodiment, and FIG. 1B shows a wiring structure 1a after carrying out the heat treatment on the wiring structure 1.

Referring to FIG. A, the wiring structure 1 comprises a silicon layer 10, a buffer layer (backing layer) 20 formed on a surface of the silicon layer 10, and a copper (Cu) layer 20 formed on an opposite surface of the backing layer 20 with respect to the surface contacting to the silicon layer 10. Herein the backing layer 20 may be understood as a base layer.

In this preferred embodiment, the silicon layer 10 includes both of a silicon thin film and a silicon substrate. The silicon layer 10 is a semiconductor layer comprising a single crystal silicon, a polycrystalline silicon or an amorphous silicon. In addition, the wiring structure 1 may be provided on a substrate for mounting an electronic component (e.g. glass substrate).

The backing layer 20 comprises Cu, manganese (Mn) and inevitable impurities. In other words, the backing layer 20 comprises a copper alloy doped with Mn (Cu—Mn based alloy). Mn is a doping element which suppresses diffusion of Cu into silicon, and reacts with Si and Cu thereby forming a barrier layer having an electrical conductivity. In addition, the copper layer 30 comprises an oxygen free copper (OFC) with a purity of 3N or more. The copper layer 30 is applied to a wiring layer of the electronic device.

Next, with referring to FIG. 1B, formation of the wiring structure 1a is explained. When the heat treatment at a predetermined temperature is carried out on the wiring structure 1 in the condition that oxygen is removed, a diffusion barrier layer 25 is formed at a region including an interface between the silicon layer 10 and the backing layer 20, thereby forming the wiring structure 1a. The diffusion barrier layer 25 is formed as follows. Mn included in the backing layer 20 is diffused into the interface, and enriched (incrassated) at the region including the interface, so that the diffusion barrier layer 25 comprises Si composing the silicon layer 10, Cu composing the backing layer 20, and Mn enriched at the interface. The diffusion barrier layer 25 is not an oxide but has an electrical conductivity. In addition, the diffusion barrier layer 25 is in ohmic-contact with the silicon layer 10 and the backing layer 20. Furthermore, the diffusion barrier layer 25 suppresses the diffusion of Cu composing the copper layer 30 into the silicon layer 10 and the diffusion of Si composing the silicon layer 10 into the copper layer 30. Namely, in the backing layer 20, a region with a Mn concentration higher than that in other region is formed at the interface between the silicon layer 10 and the backing layer 20.

The diffusion barrier layer 25 is formed by using a heat to be applied to the electronic device in the heat treatment process in the fabrication process of the electronic device comprising the wiring structure 1. In other words, for example, the diffusion barrier layer 25 is formed at the interface between the silicon layer 10 and the backing layer 20 by a heat applied during the heat treatment carried out on the substrate on which the wiring structure 1 was formed, after having formed a wiring for electrically connecting between electronic components mounted on the substrate by means of the wiring structure 1. As an example, the heat treatment process at a temperature from 200° C. to 300° C. is included in a TFT (thin film transistor) array formation process for forming a TFT array for liquid-crystal displays. In concrete, the TFT array is formed by laminating the silicon layer 10, the backing layer 20, and the copper layer 30, and depositing a SiN insulating layer on the copper layer 30 by CVD (chemical vapor deposition) method. The SiN insulating layer is formed by a heat treatment process at a temperature from 200° C. to 300° C. in an atmosphere of a mixture gas of silane and hydrogen. The diffusion barrier layer 25 suppressing the diffusion of Cu into the silicon layer 10 is formed at the interface between the silicon layer 10 and the backing layer 20 comprising Cu—Mn based alloy by the heat applied in the heat treatment process included in this TFT array formation process.

When the temperature of the heat treatment carried out on the wiring structure 1 is e.g. around 200° C., Mn of a certain amount in which Mn concentration is not less than 5 at % for example is added to the Cu—Mn based alloy composing the backing layer 20. The diffusion barrier layer 25 having a diffusion barrier property for suppressing the diffusion of Cu into the silicon layer 10 and the diffusion of Si into the copper layer 30 is thus formed. Herein, the formation of the diffusion barrier layer 25 becomes easier and the diffusion barrier property is improved by increasing the Mn concentration in the Cu—Mn based alloy than 5 at %. Further, even if the temperature of the heat treatment carried out on the wiring structure 1 is higher than 200° C., it is possible to form the diffusion barrier layer 25 having the diffusion barrier property by increasing the Mn concentration.

(Method for Fabricating the Wiring Structure 1 and the Wiring Structure 1a)

Figure 2:
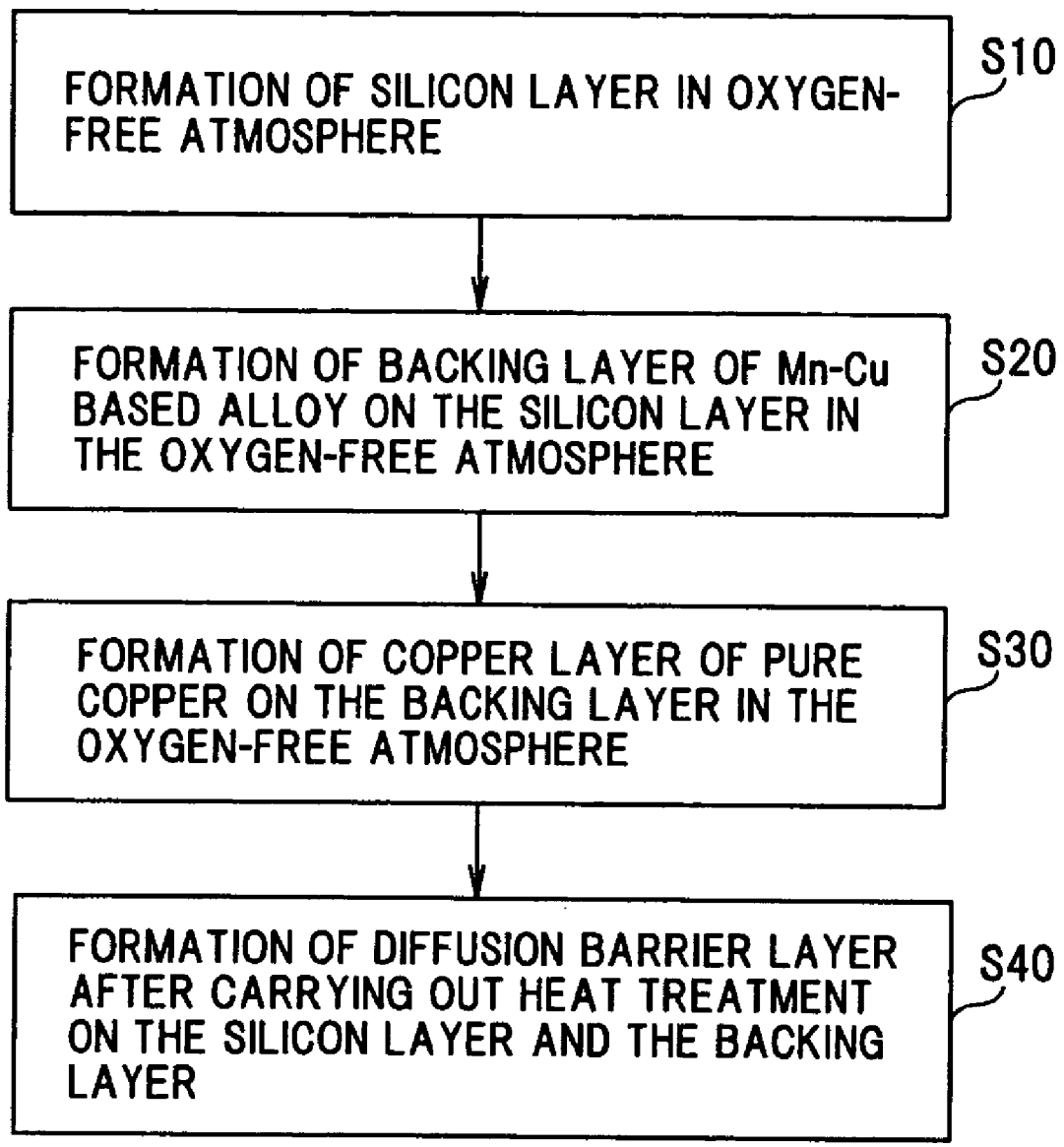
FIG. 2 is a flowchart showing a fabrication process of the wiring structure in the preferred embodiment according to the present invention.

FIG. 2 is a flowchart showing a fabrication process of the wiring structure in the preferred embodiment according to the present invention.

At first, a silicon layer 10 is formed on a substrate of glass substrate (silicon layer preparation step: Step 10. Hereinafter, a "step" is abbreviated as "S").

Next, a backing layer 20 comprising Mn—Cu based alloy is formed on the silicon layer 10 (backing layer forming step: S20).

Successively, a copper layer 30 comprising a pure copper is formed on the backing layer 20 (copper layer forming step: S30). Thereby, the wiring structure 1 in this preferred embodiment is formed. Herein, each of the silicon layer 10, the backing layer 20 and the copper layer 30 is formed in an oxygen free atmosphere. Each of the silicon layer 10, the backing layer 20 and the copper layer 30 is formed by e.g. sputtering process.

The backing layer 20 may be formed by sputtering process using a chip-on-target or a Cu alloy target. Herein, the sputtering process using the chip-on-target is a technique of carrying out sputtering in the condition that a metal chip including a doping element (Mn in this preferred embodiment) is stuck on a surface of a Cu target material which is a main material. In other words, the chip-on-target is a sputtering target in which a predetermined amount of a metal chip including a desired element is stuck on a predetermined location of a surface of a target material comprising a main material (Cu target material in this preferred embodiment). It is possible to control a ratio of the metal chip to the main material (namely a composition of the material to be deposited), by adjusting a chip size of the metal chip to be stuck on the target comprising the main material, a location of the chip with respect to the target comprising the main material fee, and the number of sheets of the chip to be stuck.

Next, the diffusion barrier layer 25, which is an interface reaction layer formed at the interface between the silicon layer 10 and the backing layer 20, is formed by carrying out the heat treatment for at least the silicon layer 10 and the backing layer 20 of the wiring structure 1 (diffusion barrier forming process: S40).

According to this process, the wiring structure 1a having a layered structure comprising the copper layer 30/the backing layer 20/the diffusion barrier layer 25/the silicon layer 10 is formed. The heat treatment may be carried out for example within a range from 200° C. to 400° C. In addition, the concentration of Mn included in the diffusion barrier layer 25 may be increased in accordance with an elevation in the temperature of the heat treatment to be carried out on the wiring structure 1. When Mn included in the backing layer 20 is diffused into the interface between the backing layer 20 and the silicon layer 10 by the heat treatment thereby forming the diffusion barrier layer 25 comprising Cu, Mn, and Si at the interface, the amount of Mn diffused at the interface is increased in accordance with the elevation of the heat treatment temperature.

Herein, the heat treatment is carried out in the atmosphere from which the oxygen is removed. For example, the heat treatment is carried out in the oxygen free and reduced pressure atmosphere (e.g., in a vacuum under a pressure of around 1 Pa). According to this heat treatment process, Mn included in the backing layer 20 is diffused into the interface between the backing layer 20 and the silicon layer 10, and Mn is enriched at the region including the interface. Then, Si composing the silicon layer 10, Cu included in the backing layer 20, and enriched Mn react with each other at the region including the interface, thereby forming the diffusion barrier layer 25.

Advantages of the Preferred Embodiment

According to the wiring structure 1 in the preferred embodiment, when the heat is applied to the wiring structure 1, the diffusion barrier layer 25 is formed by at the interface between the silicon layer 10 and the backing layer 20, thereby forming the wiring structure 1a. According to this structure, it is not necessary to provide the wiring structure 1 with a diffusion barrier layer comprising a high melting metal (refractory metal) material such as Mo. Further, as compared to the conventional method in which an insulating barrier layer comprising an oxide is formed between the silicon layer 10 and the backing layer 20, it is not necessary to achieve the electrical conduction by the tunnel current and to conduct a precise process control for forming a barrier layer having a film thickness enough for showing the diffusion barrier property. Therefore, it is possible to simplify the fabrication process and contribute to reduce the fabrication cost.

Further, in the preferred embodiment, when Cu and Mn of the backing layer 20 react with Si of the silicon layer 10 to have the electrical conductivity, and oxygen does not involve with formation of the diffusion barrier layer 25 in contact with the silicon layer 10 and the backing layer 20. Therefore, an insulating layer made from the oxide generated at the interface between the silicon layer 10 and the backing layer 20 is not formed between the silicon layer 10 and the backing layer 20. Accordingly, in the preferred embodiment, it is possible to provide the electrical conduction between the silicon layer 10 and the backing layer 20 by directly supplying the electric current through the diffusion barrier layer 25.

Further, according to the wiring structure 1 and wiring structure 1a in the preferred embodiment, it is possible to form the copper layer 30 comprising the pure copper of purity not less 3N on the diffusion barrier layer 25 via the backing layer 2. Therefore, when using the wiring structure 1 and the wiring structure 1a in the preferred embodiment for forming a wiring applied to e.g. an electronic component such as TFT array substrate provided in a large-scale liquid crystal panel, a silicon device using silicon such as a silicon solar cell, it is possible to form a copper wiring with a low resistivity and high reliability.

Further, according to the wiring structure 1a in the preferred embodiment, since a thickness of the copper layer 30 can be formed greater than the thickness of the diffusion barrier layer 25, it is possible to reduce an influence due to the formation of the diffusion barrier layer 25 on a wiring resistance of the wiring structure 1a.

In addition, the wiring structure 1a comprises a layered structure of metal materials substantially similar to the copper layer 30/the backing layer 20. In other words, since the diffusion barrier layer 25 is formed from Si, Cu, and Mn, Cu of the copper layer 30, Cu—Mn based alloy of the backing layer 20, and materials of the diffusion barrier layer 25 are the same kinds of metallic materials, so that the copper layer 30, the backing layer 20 and the diffusion barrier layer 25 compose the layered structure. Therefore, the etching work of the electrode in the preferred embodiment is easier than that in the Cu/Mo layered structure. According to this structure, it is possible to reduce the fabrication cost.

EXAMPLES

In Examples, samples for analysis (layered structure 2) of the diffusion barrier property of the diffusion barrier layer 25 were prepared.

(Sample for Analysis of the Diffusion Barrier Property)

Figure 3:
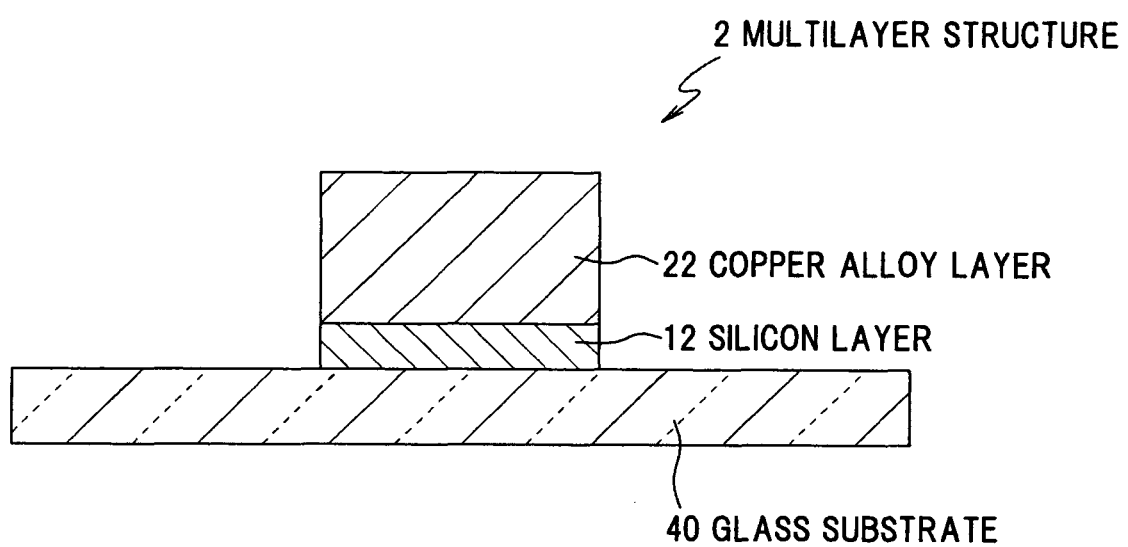
FIG. 3 is schematic diagram of a vertical cross section of a layered structure which is a sample for analysis of a diffusion barrier property in Examples of the present invention.

FIG. 3 is schematic diagram of a vertical cross section of a layered structure which is a sample for analysis of a diffusion barrier property in Examples of the present invention.

In the Examples, the layered structure 2 comprising a glass substrate 40, a silicon layer 12 formed on the glass substrate 40, and a copper alloy layer 22 formed on the silicon layer 12 was prepared. The layered structure 2 was formed by contacting a metal mask having an aperture of 3 mm-square on the glass substrate 40 and forming the silicon layer 12 and the copper alloy layer 22 by the sputtering process. The copper alloy layer 22 as a backing layer was formed by the chip-on-target method.

The copper alloy layer 22 in the Examples was formed on the silicon layer 12 by carrying out the sputtering process on a Mn chip stuck on a surface of a Cu target material which was a main material. As a sputtering apparatus, a high frequency (radio frequency: RF) magnetron sputtering apparatus was used. As to sputtering condition, formation of both of the silicon layer 12 and the copper alloy layer 22 was carried out in plasma of pure argon (Ar) gas with a chamber inner pressure of 1 Pa and a power of 300 W.

As comparative examples, samples of layered structure in which the copper alloy layer 22 in the Examples is replaced with a Cu—Mg based alloy layer were prepared.

TABLE 1 shows the detailed structure and the sputtering condition of the layered structures in the Examples and the comparative examples.

TABLE 1

|  | Examples[1] | Comparative example |
| --- | --- | --- |
| Layered structure of a sample for analysis of a diffusion barrier property | Cu alloy 100 nm/Si 50 nm/glass substrate | |
| Doping element to a copper alloy layer | Mn | Mg |
| Doping element concentration in as depo.film (M/(Cu + M)at %)[2] | | 3, 5, 10[3] |
| Sputtering condition | Gas: pure Ar, chamber inner pressure: 1 Pa, power: 300 W | |

[1]Doping element concentration of the sample for analysis in the Examples is 5 and 10.
[2]M is a doping element.
[3]These values are target values.

In the sputtering process, the copper alloy layer 22 in which the doping element is substantially uniformly solid-solute was formed. In the Examples, for a so-called "as depo. film" (film as deposited), a composition of the copper alloy layer 22 that is an uppermost layer was analyzed by energy dispersive X-ray spectrometer (EDX). A concentration of doping element (M/(Cu+M)at %) in the as depo. film was calculated from peaks measured by the EDX measurement, by determining a total of Cu and doping element M (M, Mn or Mg) as 100 at %. As a result, the doping element concentration in the copper alloy layer 22 that is the as depo. film of the analysis sample in each of the Examples was 5.1 at % Mn (Example 1) and 10.4 at % Mn (Example 2), respectively. On the other hand, the doping element concentration in the Cu—Mg based alloy layer of the analysis sample in each of the comparative example was 3.2 at % Mn (Comparative example 1), 3.4 at % Mg (Comparative example 2), 5.4 at % Mg (Comparative example 3), and 10.2 at % Mg (Comparative example 4), respectively.

(Measurement of the Resistivity of the Copper Alloy Layer 22)

Figure 4:
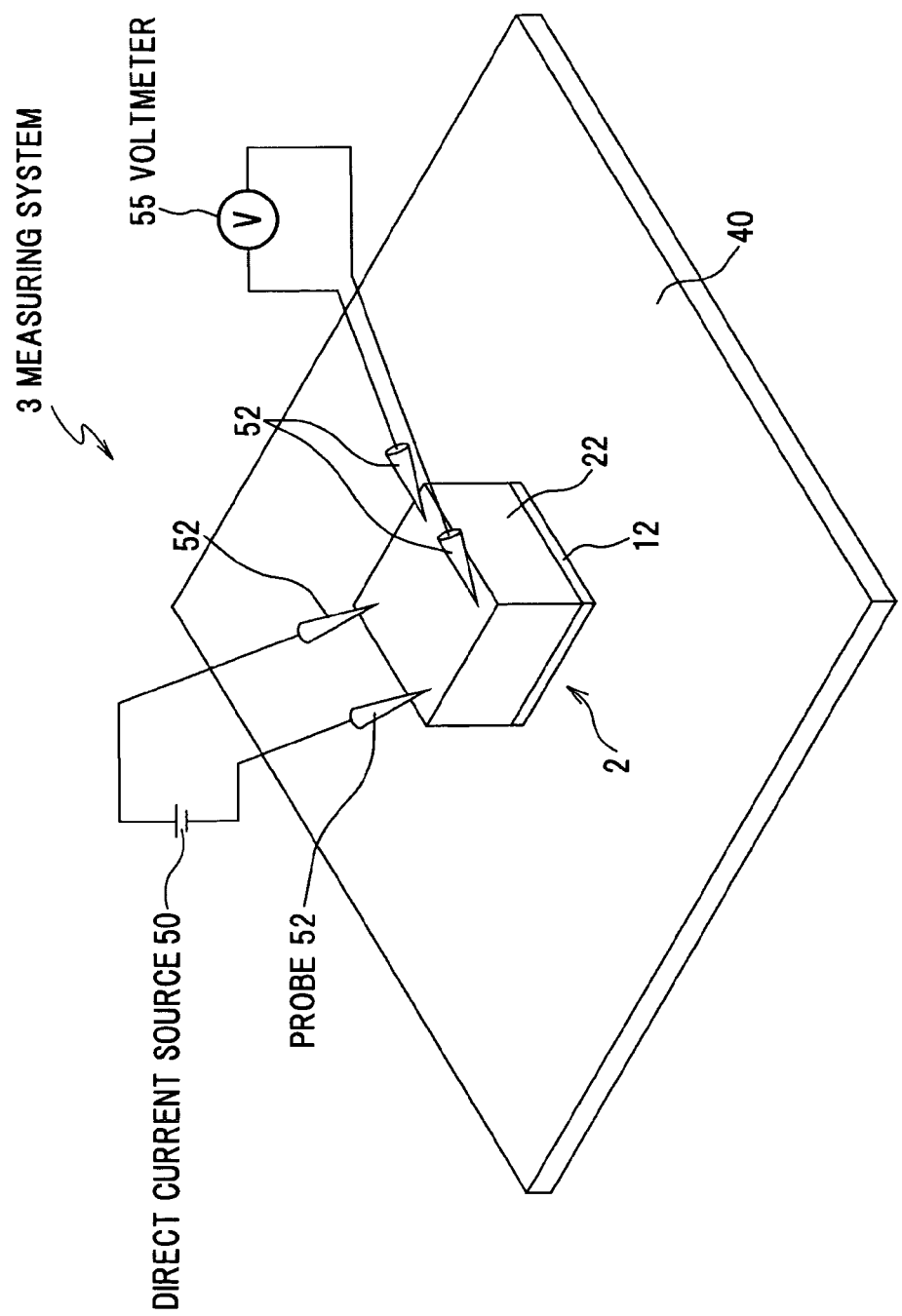
FIG. 4 is a schematic diagram showing a measuring system of the layered structure which is a sample for analysis of a resistivity in the Examples of the present invention.

FIG. 4 is a schematic diagram showing a measuring system of the layered structure which is a sample for analysis of a resistivity in the Examples of the present invention.

As shown in FIG. 4, probes 52 were located to contact with four corners of the surface of the copper alloy layer 22 that is un uppermost layer of the layered structure 2 (a sample for analysis of the resistivity). Herein, two probes 52 were connected to a direct current source 50, and two other probes 52 are connected to a voltmeter 55, thereby composing a measuring system 3.

The copper alloy layer 22 of the layered structure 2 is the as depo. film, and has a size of 3 mm-square in its top plan view. The resistivity of the copper alloy layer 22 was measured by Van der Pauw method. After having measured the resistivity, the heat treatment was carried out on the layered structure 2 for 30 minutes in vacuum at a temperature of 200° C., 250° C., and 300° C., respectively. The resistivity of the copper alloy layer 22 after the heat treatment was re-measured by the Van der Pauw method.

Further, another layered structure 2 fabricated by a fabrication process same as that of the layered structure 2 (the sample for analysis of the resistivity) was prepared. The heat treatment was carried out on the layered structure 2 thus prepared for 30 minutes in vacuum at a temperature of 200° C., 250° C., and 300° C., respectively. Successively, an element distribution analysis in a depth direction of the copper layer 22/the silicon layer 12/the glass substrate 40 was carried out by X-ray photoelectron spectroscopy (XPS).

(Analysis of the Resistivity of the Copper Alloy Layer 22)

Figure 5:
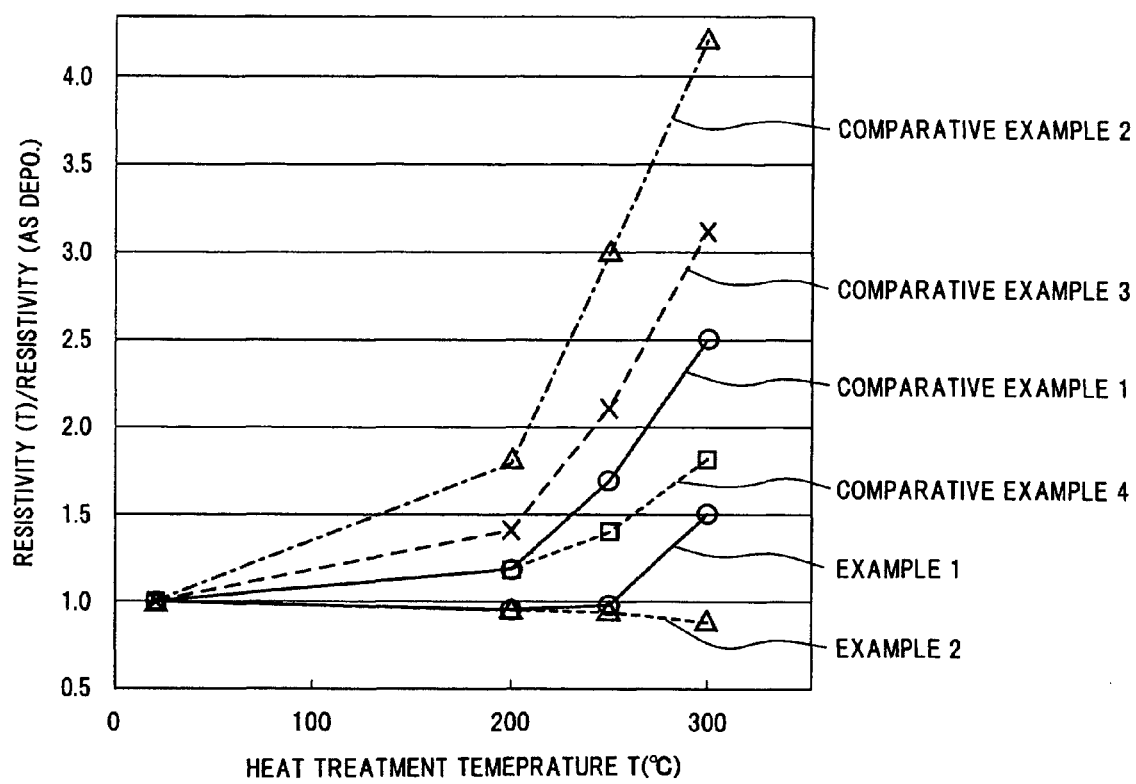
FIG. 5 is a graph showing a variation in resistivity due to a difference of a temperature of heat treatment carried out for a sample for analysis of resistivity.

FIG. 5 is a graph showing a variation in resistivity due to a difference of a temperature of heat treatment carried out for a sample for analysis of resistivity.

In concrete, FIG. 5 shows a plotted resistivity of the copper alloy layer 22 (a value standardized in the resistivity of the copper alloy layer 22 as deposited) for a temperature of each heat treatment carried out on the sample for analysis of the resistivity.

The copper alloy 22 of the sample for analysis in the Example 1 comprises Cu-5.1 at % Mn.

The copper alloy 22 of the sample for analysis in the Example 2 comprises Cu-10.4 at % Mn.

The copper alloy 22 of the sample for analysis in the Comparative example 1 comprises Cu-3.2 at % Mn.

The copper alloy 22 of the sample for analysis in the Comparative example 2 comprises Cu-3.4 at % Mg.

The copper alloy 22 of the sample for analysis in the Comparative example 3 comprises Cu-5.4 at % Mg.

The copper alloy 22 of the sample for analysis in the Comparative example 4 comprises Cu-10.2 at % Mg.

As to the analysis samples in the Examples, i.e. the analysis samples in the Examples 1 and 2 in which 5.1 at % of Mn and 10.4 at % of Mn are respectively added, the resistivity was slightly decreased until 300° C. in the case that 10.4 at % of Mn is added (Example 2), and the resistivity was substantially constant until 250° C. while the resistivity at 300° C. was higher than the resistivity at 250° C. in the case that 5.1 at % of Mn is added (Example 1). On the other hand, as to the analysis samples in the Comparative examples, i.e. the analysis sample in which 3.2 at % of Mn is added (Comparative example 1), and the analysis samples in which Mg is added respectively (Comparative examples 2 and 4), the resistivity was increased from the point of 200° C.

A region where a change of the resistivity is not remarkable (i.e. the resistivity is substantially constant) shows that diffusion of Si into the copper alloy layer 22 is little even though the heat treatment is carried out on the layered structure of the copper alloy layer 22 and the silicon layer 12. On the other hand, it is contemplated that a region where the resistivity is increased in accordance with the heat treatment temperature shows progress of the diffusion of Si into the copper alloy layer 22. Further, as to the sample for analysis in the Examples, the resistivity is slightly decreased at the heat treatment temperature of 200° C. It is assumed that the layer structure of the as depo. film was a crystal structure with relatively numerous defects and the defects were restored by the heat treatment, so that the number of the defects was decreased. As understood from FIG. 5, it is preferable that the amount of Mn doped to the copper alloy layer 22 is not less than 5 at %.

Figure 6:
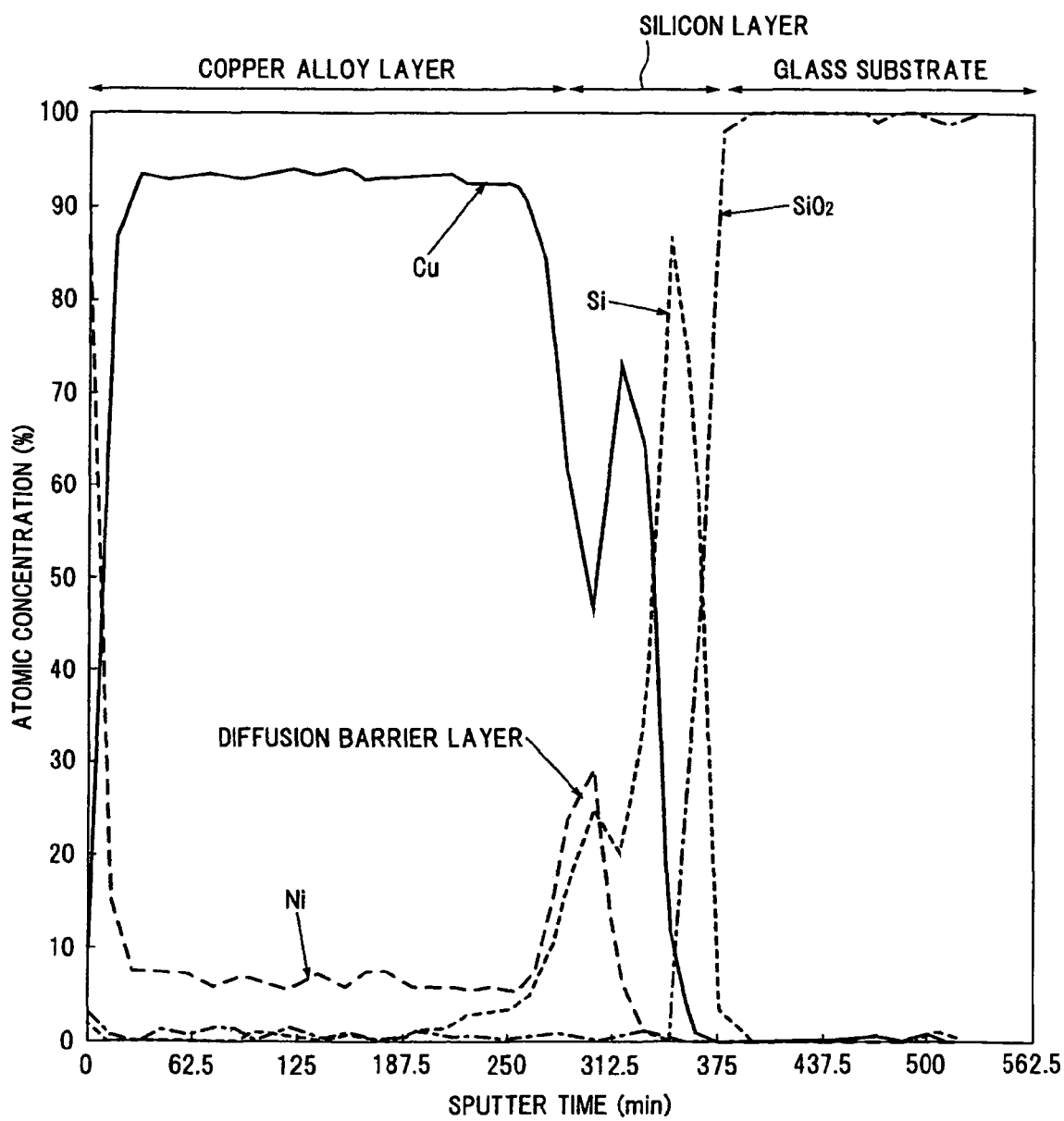
FIG. 6 is a graph showing a result of XPS analysis after the heat treatment of the sample for analysis of resistivity in the Examples of the present invention.

FIG. 6 is a graph showing a result of XPS analysis after the heat treatment of the sample for analysis of resistivity in the Examples of the present invention.

In concrete, FIG. 6 shows the result of the XPS analysis of Cu-10.4 at % Mn (the sample for analysis in Example 2) in which the variation in the resistivity was little (the resistivity was constant) after the heat treatment of 300° C. A horizontal scale of FIG. 6 shows a time of sputtering a surface of a measuring object (object to be measured), and corresponds to a film thickness orientation. Namely, in FIG. 6, a left side region, a center region, and a right side region correspond to the copper alloy layer 22, the silicon layer 12, and the glass substrate 40, respectively. A vertical scale corresponds to an element concentration.

With referring to an element distribution profile of the sample for analysis of Cu-10.4 at % Mn in the Example 2, a peak of Si that is separated keenly was observed, so that it was assumed that there was a little corrosion due to the diffusion of Cu of the copper alloy layer 22 into the silicon layer 12. In addition, it was observed that Mn was enriched at the interface between the silicon layer 12 and the copper alloy layer 22. In other words, it was contemplated that the diffusion barrier layer was formed in the region where Mn was enriched.

Figure 7:
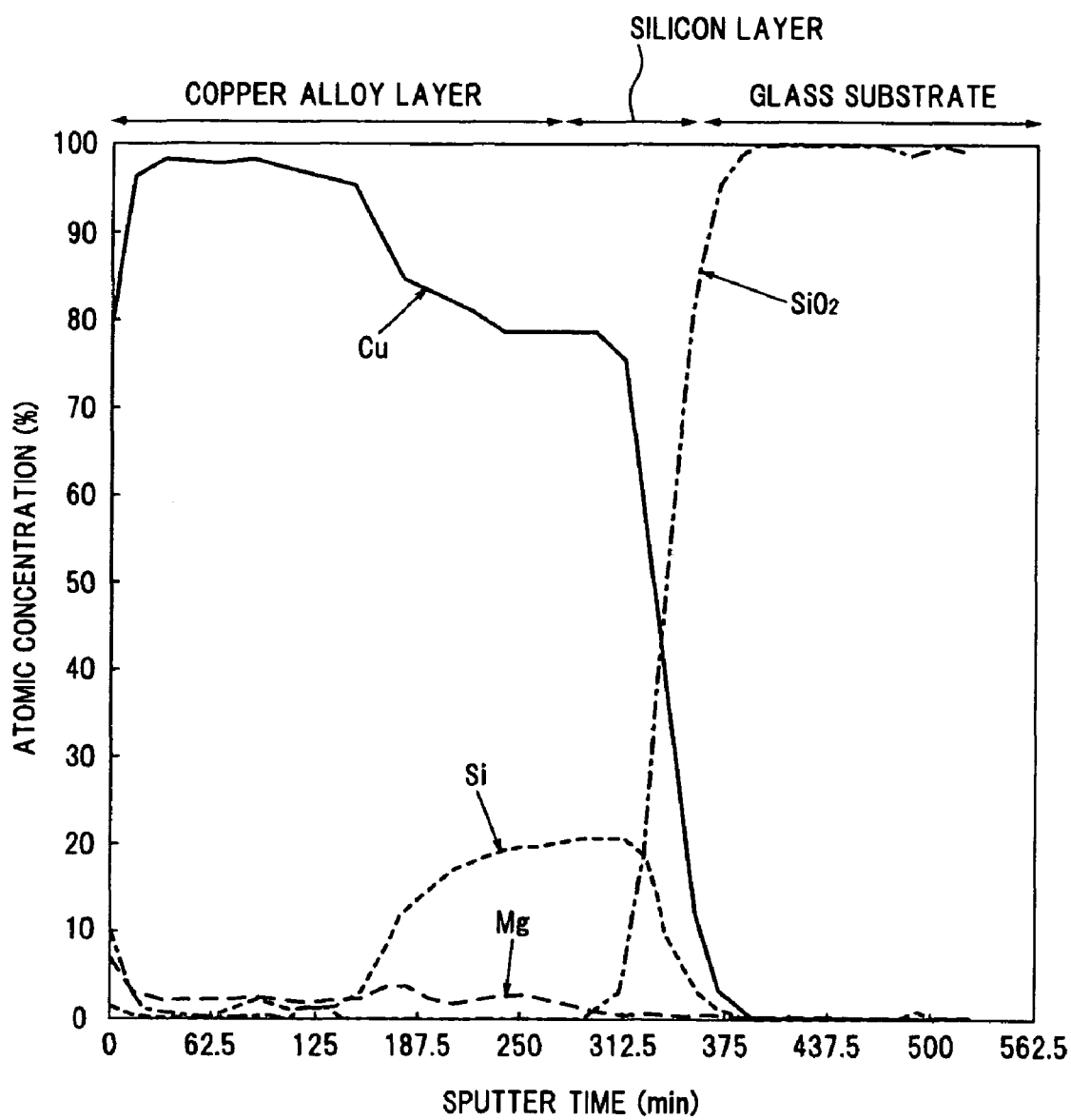
FIG. 7 is a graph showing a result of XPS analysis after the heat treatment of the sample for analysis of resistivity in the comparative examples of the present invention.

FIG. 7 is a graph showing a result of XPS analysis after the heat treatment of the sample for analysis of resistivity in the Comparative examples of the present invention.

In concrete, FIG. 7 shows the result of the XPS analysis of Cu-3.4 at % Mg (the sample for analysis in the Comparative example 2) in which the resistivity was increased from the point of 200° C. With referring to an element profile of the XPS analysis of the sample for analysis in the Comparative example 2, a peak of Si is trapezoidal and lower than a profile of Cu, and it was observed that Cu was distributed in a distribution location of Si, which shows that a mutual diffusion of Si and Cu occurred.

Similarly, as to the other samples for analysis in the Examples, it was observed that the Si profile of the other analysis samples is gently curved and trapezoidal in the Comparative examples where the resistivity was increased, while the keenly separated Si peak was observed in the Examples where the resistivity was constant. It is clearly shown at least that no barrier layer was formed in the sample for analysis having an alloy layer including Mg as against the sample for analysis having an alloy layer including Mn.

Herein, the XPS analysis is a technique of scraping a sample surface for analysis by plasma sputtering, and conducting a quantitative analysis of atoms of an exposed surface. An irregularity is observed at the scraped surface of the sample for analysis, and analysis value in a depth position of the horizontal scale of the profile includes the condition around the specific position. Therefore, the "footing", in which an element distribution appears greater than a real element distribution, is observed in the profile.

(Ohmic Contact Property of the Diffusion Barrier Layer 25 and the Resistivity Analysis of the Copper Layer 30)

Next, samples for analysis (layered structure 2a) of the ohmic contact property of the diffusion barrier layer 25 to the silicon layer 12 and the resistivity of a pure copper layer 32 were prepared. The layered structure 2a has a structure similar to the layered structure 2 in the Examples 1 and 2 and the Comparative examples 1 to 4 except that the pure copper layer 32 comprising an oxygen free copper (OFC) is formed on the copper alloy layer 22. Therefore, the detailed description of the structure is omitted.

Figure 8:
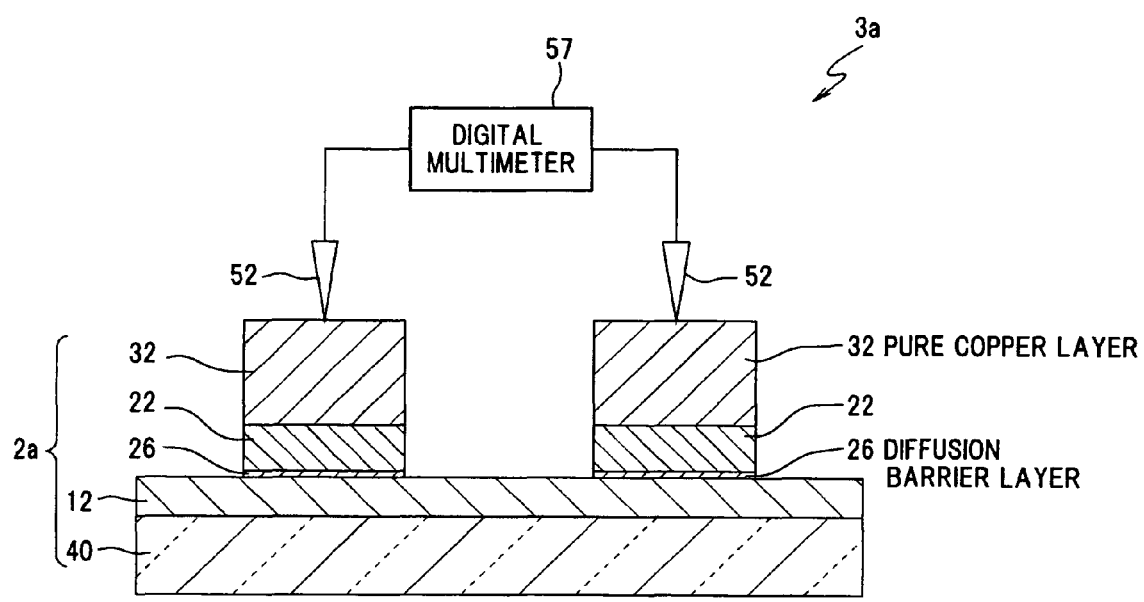
FIG. 8 is a schematic diagram showing a measuring system of an ohmic contact property and resistivity of a copper layer of the sample for analysis.

FIG. 8 is a schematic diagram showing a measuring system of an ohmic contact property and resistivity of a copper layer of the sample for analysis.

Firstly, the layered structure 2a comprising a glass substrate 40, a silicon layer 12 formed on the glass substrate 40, a plurality of copper alloy layers 22 separated from each other and each having a size of 3 mm-square in its top plan view, and the pure copper layer 32 provided on each of the copper alloy layers 22. A sample for analysis in Example 3 corresponds to the sample for analysis in the Example 1. A sample for analysis in Example 4 corresponds to a sample for analysis in Example 2. Similarly, each of samples for analysis in Comparative examples 5 to 8 corresponds to each of samples for analysis in the Comparative examples 1 to 4. Herein, the pure copper layer 32 comprises the oxygen free copper layer of 3N.

The copper alloy layer 22 in the Examples 3 and 4 was formed on the silicon layer 12 by carrying out the sputtering process on a Mn chip stuck on a surface of a Cu target material which was a main material. As a sputtering apparatus, a high frequency (radio frequency: RF) magnetron sputtering apparatus was used. As to sputtering condition, formation of all of the silicon layer 12, the copper alloy layer 22 and the pure copper layer 32 was carried out in plasma of pure argon (Ar) gas with a chamber inner pressure of 1 Pa and a power of 300 W.

As the Comparative example 5, a sample of layered structure in which the copper alloy layer having a Mn composition different from those in the Examples 3 and 4 was prepared. As the Comparative examples 6 to 8, samples of layered structure in which the copper alloy layer as the backing layer is replaced with Cu—Mg based alloy were prepared.

TABLE 2 shows the detailed structure and the sputtering condition of the layered structures in the Examples and the Comparative examples.

TABLE 2

| | Examples[1] | Comparative example |
|---|---|---|
| Layered structure of a sample for analysis | OFC 300 nm/Cu alloy 100 nm/ glass substrate | |
| Doping element to a copper alloy layer | Mn | Mg |
| Doping element concentration in as depo.film (M/(Cu + M)at %)[2] | 3, 5, 10[3] | |
| Sputtering condition | Gas: pure Ar, chamber inner pressure: 1 Pa, power: 300 W | |

[1]Doping element concentration of the sample for analysis in the Examples is 5 and 10.
[2]M is a doping element.
[3]These values are target values.

For the purpose of evaluating the ohmic contact property between the copper alloy layer 22 comprising Cu—Mn alloy and the silicon layer 12, the measurement was conducted by contacting the probe 52 to the surface of two pure copper layers 32 (hereinafter, a part composed of the copper alloy layer 22 and the pure copper layer 32 is referred to as "electrode pad") as shown in FIG. 8. Each of the probes 52 was connected to a digital multimeter 57.

Figure 9:
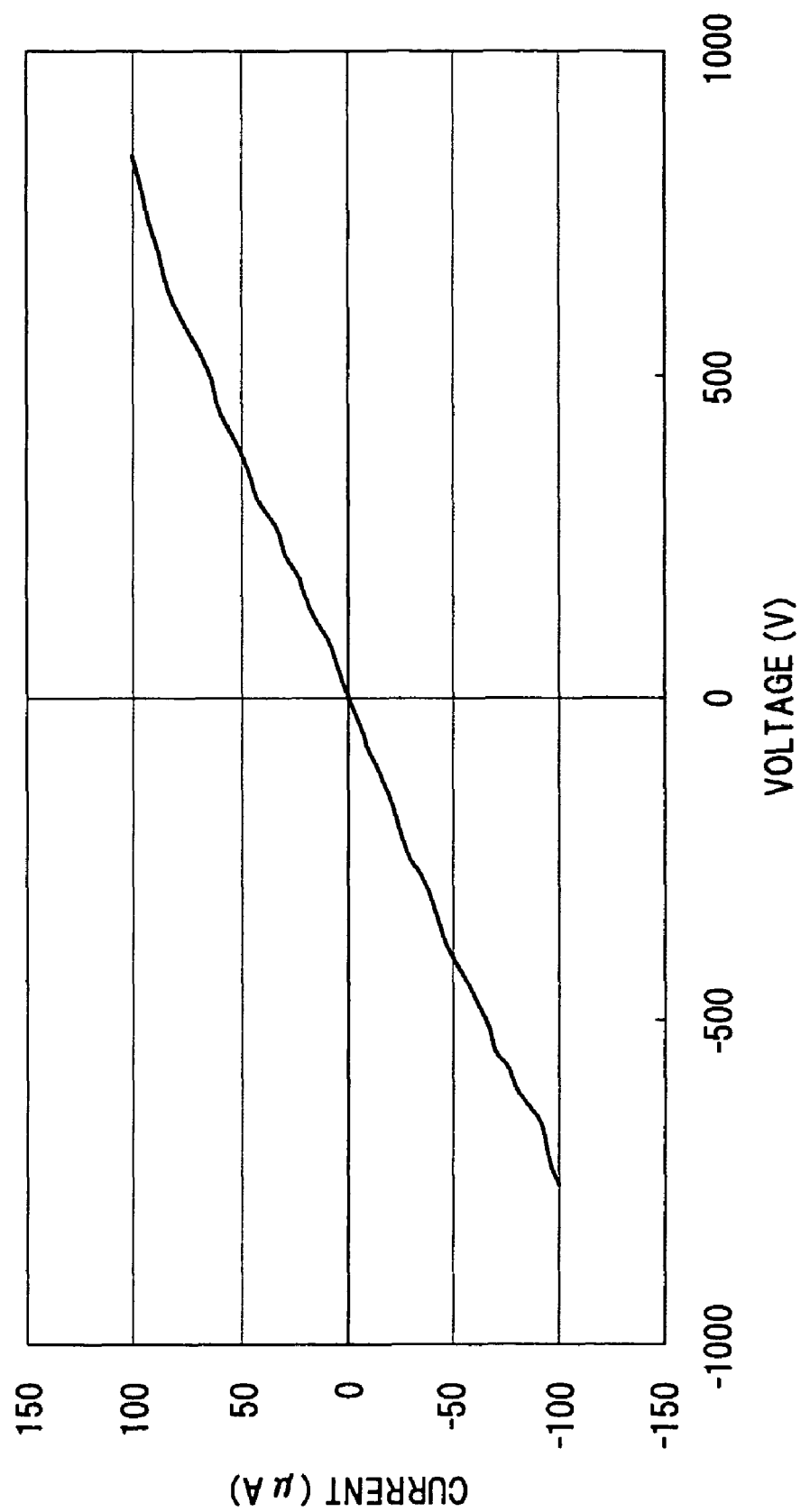
FIG. 9 is a graph showing an analysis result of the ohmic contact property of the sample for analysis in Example 4.

FIG. 9 is a graph showing an analysis result of the ohmic contact property of the sample for analysis in Example 4.

In the sample for analysis in the Example 4 (the copper alloy layer 22: Cu-10.4 at % Mn, heat treatment at 300° C.), a current/voltage characteristic was substantially linear. Therefore, it was shown that the ohmic contact was provided between the diffusion barrier layer 26 and the silicon layer 12 in the sample for analysis in the Example 4. For all of the other analysis samples (analysis samples in the Example 3 and the Comparative examples 5 to 8), the current/voltage characteristic was substantially linear so that the ohmic contact property was provided at a temperature of 200° C., 250° C. and 300° C.

Further, similarly to the method explained with referring to FIG. 4, the resistivity of the pure copper layer 32/the copper alloy layers 22 was measured by contacting four probes 52 to one electrode pad. Herein, the resistivity was calculated based on the film thickness of the pure copper layer 32. TABLE 3 shows the measurement result of the resistivity as well as the diffusion barrier property and the ohmic contact property.

current, by suppressing the diffusion of Cu from the copper alloy layer 22 into the silicon layer 12.

Herein, the copper alloy layer 22 is formed to have a film thickness of dozens of nanometers for the purpose of effectively suppressing the reach of silicon to the pure copper layer 32. As an example, the copper alloy layer 22 has a film thickness of around 40 nm, more preferably 50 nm or more.

Although the invention has been described with respect to the specific embodiments for complete and clear disclosure, the appended claims are not to be therefore limited but are to be construed as embodying all modifications and alternative

TABLE 3

| | | Doping Element | Doping Element Concentration (at %) | Diffusion barrier Property | | | Ohmic contact Property[1] | | | Pure copper resistivity (μΩcm)[2] | | |
|---|---|---|---|---|---|---|---|---|---|---|---|---|
| | | | | 200° C. | 250° C. | 300° C. | 200° C. | 250° C. | 300° C. | 200° C. | 250° C. | 300° C. |
| Comparative Example 1 | Comparative Example 5 | Mn | 3.2 | X | X | X | ○ | ○ | ○ | 2.0 | 2.2 | 2.3 |
| Example 1 | Example 3 | Mn | 5.1 | ○ | ○ | X | ○ | ○ | ○ | 2.0 | 2.1 | 2.3 |
| Example 2 | Example 4 | Mn | 10.4 | ○ | ○ | ○ | ○ | ○ | ○ | 2.0 | 2.0 | 2.0 |
| Comparative Example 2 | Comparative Example 6 | Mg | 3.4 | X | X | X | ○ | ○ | ○ | — | — | — |
| Comparative Example 3 | Comparative Example 7 | Mg | 5.4 | X | X | X | ○ | ○ | ○ | — | — | — |
| Comparative Example 4 | Comparative Example 8 | Mg | 10.2 | X | X | X | ○ | ○ | ○ | — | — | — |

[1]Examples 3 and 4 and Comparative examples 5 to 8 are evaluated.
[2]"—" means that the evaluation is not conducted.

As for the analysis of the presence of the diffusion barrier property, the diffusion barrier property was evaluated as "present" (○), when an increase in the resistivity due to the heat treatment was not observed and the keenly separated peak of Si was observed by the XPS analysis. On the other hand, the diffusion barrier property was evaluated as "absent" (x), when both or either of the case that the increase in the resistivity due to the heat treatment was observed and that the keenly separated peak of Si was observed by the XPS analysis.

As for the analysis of the presence of the ohmic contact property, the ohmic contact property was evaluated as "present" (○), when the current/voltage characteristic was substantially linear and an inflection point was not shown, while the ohmic contact property was evaluated as "absent" (x), when the inflection point was shown.

As a result, the diffusion barrier property was not provided in the samples for analysis in the Comparative examples 5 to 8. Due to the absence of the diffusion barrier property, the characteristics as a semiconductor of the silicon layer 12 are deteriorated in the samples for analysis in the Comparative examples 5 to 8. Further, in the samples for analysis in the Comparative examples 6 to 8, a considerable leak current is generated in the silicon layer 12 due to the diffusion of Cu into the silicon layer 12. Therefore, the resistivity of the pure copper layer 32 was not measured for the samples for analysis in the Comparative examples 6 to 8.

On the other hand, in the Examples 3 and 4, it was confirmed that it is possible to provide the layered structure having the diffusion barrier property for the heat treatment of 200° C. and maintaining the low resistivity of the pure copper layer 32 by adding 5.1 at % or more of Mn to the copper alloy layer 22. Namely, in the Examples 3 and 4, it is possible to suppress the deterioration in the characteristics as the semiconductor of the silicon layer 12 and to suppress the leak constructions that may occur to one skilled in the art which fairly fall within the basic teaching herein set forth.

What is claimed is:

1. A wiring structure, comprising:
   a silicon layer comprising a semiconductor layer;
   a backing layer provided on the silicon layer, the backing layer comprising a copper alloy including manganese;
   a copper layer provided on the backing layer; and
   a diffusion barrier layer having an electrical conductivity, the diffusion barrier layer being provided at a region including an interface between the silicon layer and the backing layer, the diffusion barrier layer including manganese that is enriched compared with the manganese of the backing layer.

2. The wiring structure according to claim 1, wherein the diffusion barrier layer comprises a silicon composing the silicon layer, a copper composing the backing layer, and the manganese moved to the interface when the silicon layer and the backing layer are heated.

3. The wiring structure according to claim 2, wherein the diffusion barrier layer is in ohmic contact with the silicon layer.

4. The wiring structure according to claim 3, wherein the backing layer provided on the silicon layer has a manganese concentration enough to form the diffusion barrier layer showing a diffusion barrier property.

5. The wiring structure according to claim 4, wherein the copper layer comprises an oxygen free copper with a purity of 3N or more.

6. The wiring structure according to claim 1, wherein the copper alloy comprises the manganese of 5 at % or more, a balance of a copper, and inevitable impurities.

7. The wiring structure according to claim 1, wherein the enriched manganese is provided in the diffusion barrier layer at the interface between the silicon layer and the backing layer.

8. The wiring structure according to claim 1, wherein the diffusion barrier layer comprises silicon from the silicon layer, copper from the backing layer, and the enriched manganese at the interface between the silicon layer and the backing layer.

9. The wiring structure according to claim 1, wherein the electrical conductivity is maintained between the silicon layer and the copper layer.

10. The wiring structure according to claim 1, wherein the silicon layer is in ohmic contact with the copper layer.

11. The wiring structure according to claim 1, wherein the diffusion barrier layer comprises a silicon layer including silicon, a backing layer including copper, and the enriched manganese at the interface between the silicon layer of the diffusion barrier layer and the backing layer of the diffusion barrier layer.

12. The wiring structure according to claim 1, wherein the enhanced manganese is configured to suppress a diffusion of copper from the backing layer into the silicon layer and a diffusion of silicon from the silicon layer into the backing layer.

13. The wiring structure according to claim 1, wherein the diffusion barrier layer has a concentration of manganese that is greater than a concentration of manganese in the backing layer.

14. A method for fabricating a wiring structure, comprising:
forming a backing layer comprising a copper alloy including manganese on a silicon layer in an oxygen free atmosphere, the silicon layer including a semiconductor layer;
forming a copper layer on the backing layer; and
carrying out a heat treatment on the silicon layer and the backing layer to enrich the manganese at a region including an interface between the silicon layer and the backing layer, thereby forming a diffusion barrier layer having an electrical conductivity, the diffusion barrier layer comprising manganese that is enriched compared with the manganese of the backing layer.

15. The method for fabricating a wiring structure according to claim 14, wherein the copper alloy includes the manganese of 5 at % or more, a balance of a copper and inevitable impurities.

16. The method for fabricating a wiring structure according to claim 15, wherein the heat treatment is carried out on the silicon layer and the backing layer at a temperature in a range from 200° C. to 300° C. in vacuum.

17. A wiring structure, comprising:
a silicon layer comprising a semiconductor layer;
a backing layer provided on the silicon layer, the backing layer comprising a copper alloy including manganese;
a copper layer provided on the backing layer; and
a diffusion barrier layer provided at a region including an interface between the silicon layer and the backing layer, the diffusion barrier layer including manganese that is enriched compared with the manganese of the backing layer,
wherein an electrical conductivity is provided between the silicon layer and the copper layer.

18. The wiring structure according to claim 17, wherein the electrical conductivity is provided by the diffusion barrier layer.

19. A wiring structure, consisting of:
a silicon layer comprising a semiconductor layer;
a backing layer provided on the silicon layer, the backing layer comprising a copper alloy including manganese;
a copper layer provided on the backing layer; and
a diffusion barrier layer having an electrical conductivity, the diffusion barrier layer being provided at a region including an interface between the silicon layer and the backing layer, the diffusion barrier layer including manganese that is enriched compared with the manganese of the backing layer.

* * * * *